(12) United States Patent
Link et al.

(10) Patent No.: US 6,545,544 B1
(45) Date of Patent: Apr. 8, 2003

(54) EFFICIENT HIGH OVERDRIVE TRANSIMPEDANCE AMPLIFIERS

(75) Inventors: Garry Neal Link, Aloha, OR (US); David W. Entrikin, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/084,004

(22) Filed: Feb. 27, 2002

(51) Int. Cl.[7] ............................................... H03F 3/04
(52) U.S. Cl. ..................... 330/310; 330/110; 330/308
(58) Field of Search ............................... 330/110, 308, 330/310, 296

(56) References Cited

U.S. PATENT DOCUMENTS 4,713,841 A * 12/1987 Porter et al. ................ 455/608
5,311,146 A * 5/1994 Brannon et al. ............ 330/288
5,684,308 A * 11/1997 Lovejoy et al. ............. 257/184

* cited by examiner

*Primary Examiner*—Henry Choe
(74) *Attorney, Agent, or Firm*—Blakely, Sokoloff, Taylor & Zafman LLP

(57) ABSTRACT

Transimpedance amplifiers that provide moderate bandwidth and very large overdrive current capabilities while consuming a minimum amount of power supply current. Existing transimpedance amplifier topologies use a quiescent current somewhat larger than the overdrive current that must be tolerated while the present invention reduces the value of the quiescent current and can tolerate bi-directional overdrive current several times larger than the current consumption of the circuit itself. The preferred embodiment of the invention is arranged such that stability of the circuit is ensured under all operating conditions, including overdrive conditions. Various embodiments are disclosed.

5 Claims, 4 Drawing Sheets

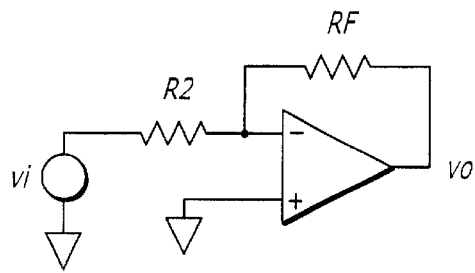
FIG. 1
(Prior Art)
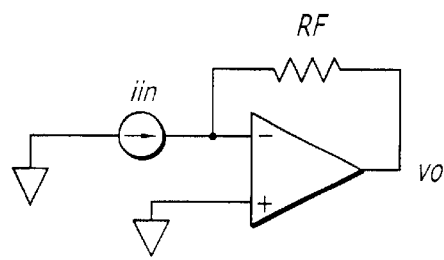
FIG. 2
(Prior Art)
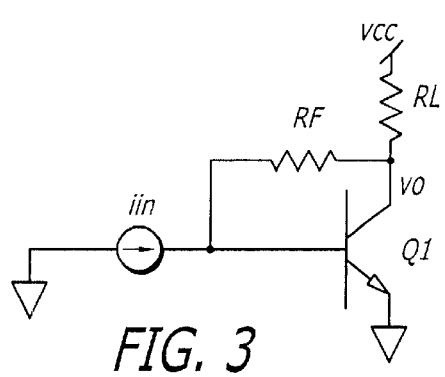
FIG. 3
(Prior Art)
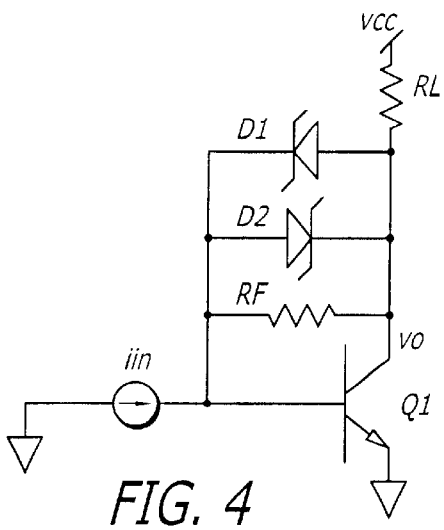
FIG. 4
(Prior Art)
FIG. 5
(Prior Art)
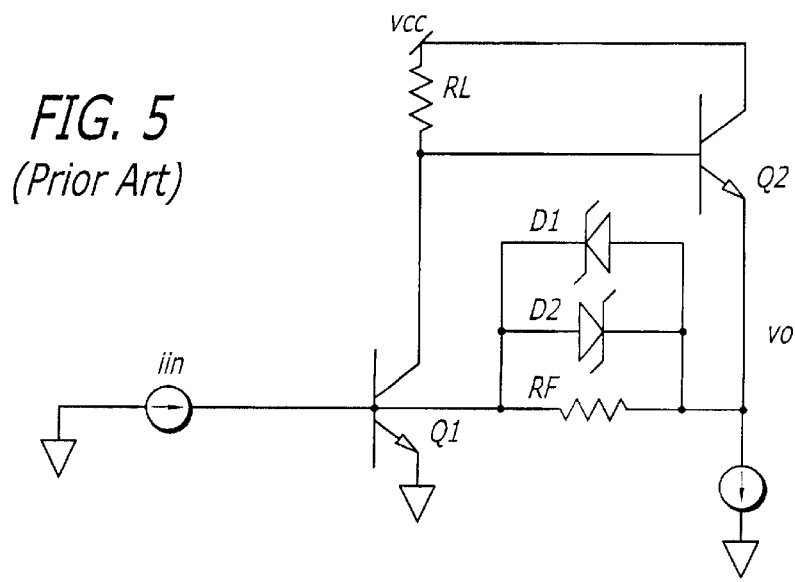

EFFICIENT HIGH OVERDRIVE TRANSIMPEDANCE AMPLIFIERS

BACKGROUND OF THE INVENTION

1. Field of the Invention

The present invention relates to the field of transimpedance amplifiers.

2. Prior Art

The Ideal Transimpedance Amplifier

A transimpedance amplifier converts an input current to an output voltage with a gain whose units are ohms. FIG. 1 shows a circuit that uses an operational amplifier (opamp) and two resistors to make a negative feedback amplifier with an inverting voltage gain. For this circuit, the equation for $v_o$ and the amplifier voltage gain $v_o/v_i$ is:

$$v_o = -v_i * RF/R2 \quad \text{(Equation 1)}$$

$$v_o/v_i = -RF/R2 \quad \text{(Equation 2)}$$

The circuit node at the noninverting input terminal of the amplifier in FIG. 1 is a virtual ground. Because this node has zero impedance, the input network which consists of voltage source $v_i$ and resistor R2 can be replaced with a current source that has a magnitude of $i_{in} = v_i/R2$. FIG. 2. shows the modified amplifier circuit.

Equation 1 may be rewritten as:

$$v_o = -RF * (v_i/R2) = -RF * i_{in} \quad \text{(Equation 3)}$$

The ideal transimpedance amplifier gain can be written as:

$$v_o/i_{in} = -RF \quad \text{(Equation 4)}$$

These equations have assumed that the amplifier has an infinite voltage gain. Since the ideal operational amplifier has no output voltage constraints, $i_{in}$ can be any magnitude (no overdrive condition). The magnitude of the gain of a real transimpedance amplifier is somewhat less than RF due to the finite gain of a real operational amplifier, and the input signal $i_{in}$ is limited in magnitude to the available output swing at $v_o$ divided by RF.

Feedback Theory and Stability

In classical feedback theory, the transfer function or closed-loop gain of a system with negative feedback is expressed as:

$$\text{Transfer function} = G/(1+GH) \quad \text{(Equation 5)}$$

Where G is the gain in the forward path only and H is the gain in the feedback path only.

G and H are usually functions of frequency, that is, their magnitudes and their phase angles change with frequency. A common way of indicating this dependence is to write G and H as $G(j\omega)$ and $H(j\omega)$, where $\omega$ is radian frequency and j is $\sqrt{-1}$.

The most important quantity in determining the stability of a negative feedback amplifier is the GH term in the denominator of Equation 5. The system's loop gain (GH) is calculated with the feedback disconnected from the input summing node, but appropriately terminated. From Equation 5, if the loop gain GH equals −1 (magnitude of 1 and phase of −180°), the transfer function is undefined because of division by zero and the system is unstable. Actually, if the absolute value of the loop gain GH is equal to or greater than 1 at the frequency where the phase of GH=−180°, then the amplifier is unstable.

This concept is the key to analyzing the stability of transimpedance amplifiers, and particularly to understanding why transimpedance amplifiers can become unstable when diode clamps are used to provide input overdrive capability.

A Simple Transimpedance Amplifier

The simplest practical transimpedance amplifier is shown in FIG. 3. Transistor Q1 and resistor RL functionally replace the opamp in FIG. 2 (the grounded emitter of the transistor may be considered the positive terminal of the opamp). The current in RF provides negative feedback from the amplifier's output to its input. The forward gain (G in Equation 5) of the amplifier is:

$$G = -\beta * RF \| RL \quad \text{(Equation 6)}$$

Where $\beta$ is the transistor current gain

The feedback gain (H in equation 5) is −1/RF, because the feedback is a current into the inverting amplifier input node. The loop gain is:

$$GH = \beta * RF \| RL/RF = \beta * RL/(RL+RF) \quad \text{(Equation 7)}$$

Equation 7 expresses only the DC or low frequency loop gain. $\beta$, the transistor current gain, is really a function of frequency. Also there are capacitances in the circuit whose impedance is a function of frequency. The largest capacitance in this circuit that affects loop gain is $C_{cb}$, the capacitance of the transistor base-collector junction. This capacitance is in parallel with RF and RL. A greatly simplified expression for the loop gain as a function of frequency is (neglecting any frequency dependence of H):

$$G(j\omega)H = \beta(j\omega) * RF \| RL \| (1/j\omega C_{cb})/RF$$

$$G(j\omega)H = \beta(j\omega) * RF \| RL \| (1/j\omega C_{cb})/RF \quad \text{(Equation 8)}$$

$$= \frac{\beta(j\omega) * \frac{RL}{RL+RF}}{1 + \frac{j\omega C_{cb} * RL * RF}{RL+RF}}$$

With respect to amplifier stability, one way to gain some insight is to set the feedback resistor RF to zero, that is, set the amplifier to have minimum gain, maximum feedback, and maximum bandwidth. If it's going to oscillate, it will oscillate under this condition. The result is:

$$G(j\omega)H = \beta(j\omega) \text{ with } RF=0 \quad \text{(Equation 9)}$$

The capacitance $C_{cb}$ doesn't play a role, since it is shorted out. The only thing that matters is if $\beta(j\omega)$ is greater than one at a frequency where its phase is −180°. This is generally not the case, as otherwise, diode-connected transistors would oscillate.

Simple Transimpedance Amplifier with Overdrive Capability

The transimpedance amplifier in FIG. 4 differs from that of FIG. 3 in that Schottky diodes D1 and D2 have been added in parallel with feedback resistor RF. Without these clamping diodes, the magnitude of the input signal $i_{in}$ is limited to about $(vcc - VCE_{sat})/RF$. With the clamping diodes, when $i_{in}$ is in positive overdrive, transistor Q1 turns on until the output voltage $v_o$ drops enough to forward bias Schottky diode D2, after which any additional input current $i_{in}$ passes through diode D2 and transistor Q1 to ground to maintain the output $v_o$ at one Schottky drop below the Vbe of transistor Q1. At the other extreme wherein $i_{in}$ is in negative overdrive, transistor Q1 will turn off until the load resistor RL pulls the output voltage $v_o$ high enough to forward bias Schottky diode D1, after which any additional negative input current $i_{in}$ passes through Schottky diode D1 to maintain the output $v_o$ at one Schottky diode drop above the Vbe of transistor Q1. Thus the diodes clamp the output voltage swing to $2*V_{diode}$ peak to peak, even with large input signals or overdrive (note that the negative input current magnitude is ultimately limited by the resistor RL). When one of the diodes turns on, the effective feedback resistance drops from RF to $R_{diode}$, which may be only a few ohms. Based on the analysis above (Equations 8 and 9), this reduction in gain and subsequent increase in bandwidth should not make the amplifier unstable.

A Buffered Transimpedance Amplifier with Overdrive Capability

FIG. 5 shows another common transimpedance amplifier topology that uses an emitter follower (transistor Q2) to buffer the load resistor RL from the feedback resistor RF. It has some advantages over the simple amplifier in FIG. 4. First, the open loop gain is larger: instead of $G=-\beta*RL\|RF$, it is:

$$G=-\beta*RL \tag{Equation 10}$$

The larger open loop gain increases the overall transimpedance gain. Second, when the output is taken at the emitter of Q2 instead of at the collector of Q1, the amplifier has greater drive capability. The output voltages and output voltage swings are the same as for the transimpedance amplifier of FIG. 4. The loop gain GH of this amplifier is (H is still $-1/RF$):

$$GH=\beta RL/RF \tag{Equation 11}$$

The loop gain of the amplifier without the emitter follower Q2 was shown to be:

$$GH=\beta*RL/(RL+RF) \tag{Equation 7}$$

With RF>>RL, the difference in magnitude of the two equations is small. But when RF is very small, GH in Equation 11 becomes very big (the maximum loop gain increases by a factor of $\beta$ due to transistor Q2). Additionally, the base-collector capacitance of transistor Q1 is no longer shorted out when RF is zero. This capacitance adds up to 90° additional phase shift around the loop (there is a pole at $1/2\pi RL*C_{cb}$). With a factor of $\beta$ times more loop gain and the possibility of 90° additional phase shift, this amplifier will oscillate when the transimpedance gain is small enough. Practically, the gain does become small enough when Schottky diode D1 or D2 turn on in overdrive, and the amplifier does become unstable.

BRIEF SUMMARY OF THE INVENTION

Transimpedance amplifiers that provide moderate bandwidth and very large overdrive current capabilities while consuming a minimum amount of power supply current are disclosed. Existing transimpedance amplifier topologies use a quiescent current somewhat larger than the overdrive current that must be tolerated while the present invention reduces the value of the quiescent current and can tolerate bi-directional overdrive current several times larger than the current consumption of the circuit itself. The preferred embodiment of the invention is arranged such that stability of the circuit is ensured under all operating conditions, including overdrive conditions. Various embodiments are disclosed.

BRIEF DESCRIPTION OF THE DRAWINGS

FIG. 1 is a prior art circuit comprising an operational amplifier and two resistors to make a negative feedback amplifier with an inverting voltage gain.

FIG. 2 is a circuit diagram of a general transimpedance amplifier using an operational amplifier and a feedback resistor.

FIG. 3 is a circuit diagram of a general transimpedance amplifier using a transistor and a feedback resistor.

FIG. 4 is a commonly used simple transimpedance amplifier topology.

FIG. 5 is a common transimpedance amplifier further incorporating an emitter follower.

DETAILED DESCRIPTION OF THE PREFERRED EMBODIMENT

The present invention comprises transimpedance amplifiers that provide moderate bandwidth and very large overdrive current capabilities while consuming a minimum amount of power supply current. These transimpedance amplifiers are suitable for amplifying the output of a photodiode, though the amplifier is suitable for various other applications also, including but not limited to use in burst-mode laser driver products, and in fiber communications preamplifiers. Existing transimpedance amplifier topologies use a quiescent current somewhat larger than the overdrive current that must be tolerated. The present invention reduces the value of the quiescent current and can tolerate bi-directional overdrive current several times larger than the current consumption of the circuit itself. The preferred embodiments of the invention are arranged such that stability of the circuits is ensured under overdrive conditions.

In the description to follow, the invention is shown and described in conjunction with the amplification of the output of a photodiode for purposes of specificity in the disclosure of a preferred embodiment, and not for purposes of limitation of the invention in any way. Further, while the invention is disclosed and claimed to include a current source (IDC), there may be applications wherein the input current to the transimpedance amplifier swings plus and minus, in which case the current source is provided by the input signal itself, all within the concepts of the invention. Similarly, the invention is disclosed and claimed to include a load resistor or resistance (RL), which resistor or resistance may comprise or include a more complex impedance than a pure resistance, and which impedance may be a load device itself. Alternatively, a load resistor may be used. The transimpedance amplifier output OUT is coupled to the collector of transistor Q1 in the embodiments disclosed herein. Also, the preferred embodiments disclosed herein are disclosed with respect to the amplification of the output of a photodiode for purposes in specificity, though the amplifiers of the present invention are not so limited. Thus the photodiode and associated photodiode capacitance C1, and current source IDC, are not part of the invention, but rather only illustrate one exemplary use of the invention.

Figure 6:
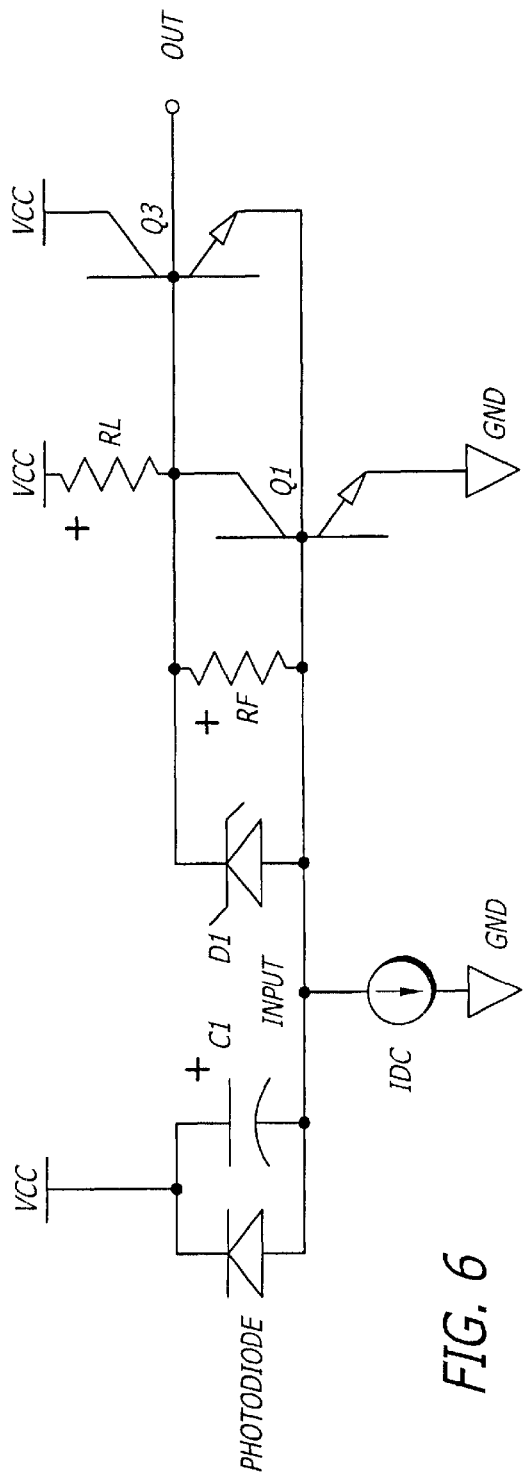
FIG. 6 is a circuit diagram for one embodiment of the present invention.

One embodiment of the present invention is shown in FIG. 6. Positive overdrive current (light detected) flows through Schottky diode D1 as in FIG. 4, the Schottky diode being oriented to provide a limit on the magnitude of the collector-emitter voltage of transistor Q1 to avoid saturation of the transistor. However the negative overdrive current (light not detected) now flows through transistor Q3. With this arrangement, the negative overdrive current no longer flows through resistor RL. Therefore, the overdrive current is larger than that in FIG. 4 by approximately a factor of the NPN transistor beta (transistor current gain), and the quiescent power supply current can be less than the overdrive current tolerated. In this embodiment, the output with light detected (or equivalent input if used for other than amplification of a photodiode output) will be one Vbe (the base-emitter voltage of transistor Q1) minus the forward conduction voltage drop of the Schottky diode above ground, and for light not detected, will be two Vbe (the base-emitter voltages of transistors Q1 and Q3) above ground.

The disadvantage of the circuit shown in FIG. 6 is that the open loop gain remains large under negative overdrive conditions, so loop stability is difficult to maintain since the closed loop gain (transimpedance) has been reduced to the output resistance of transistor Q3.

Figure 7:
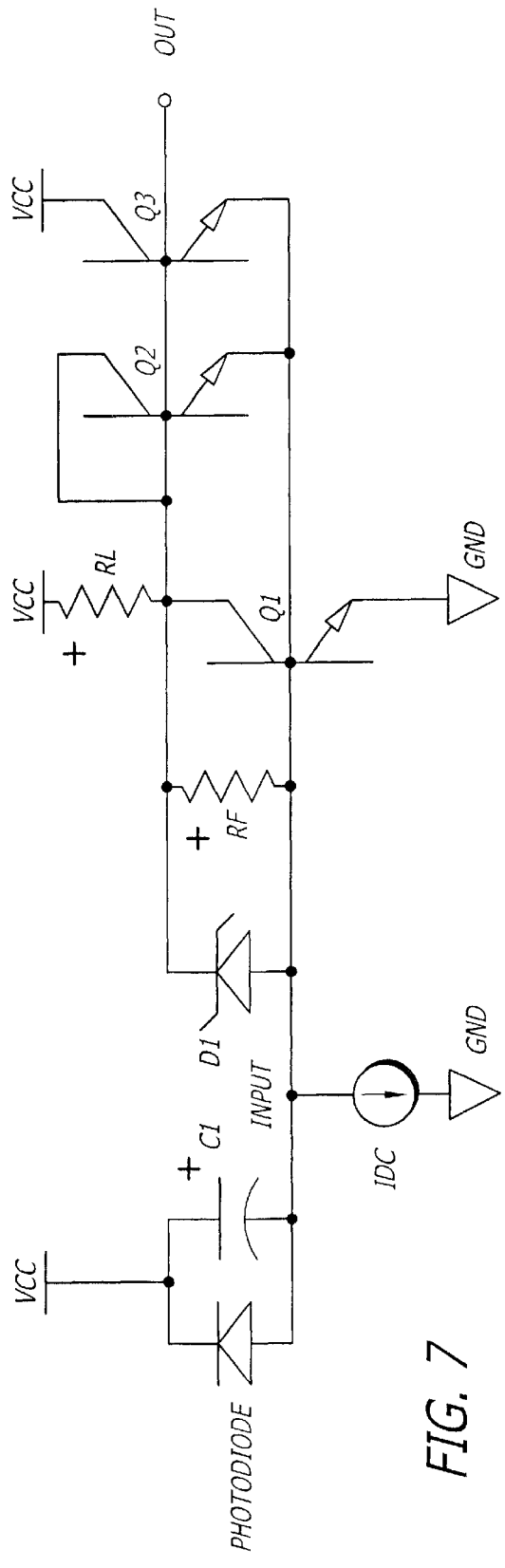
FIG. 7 is a circuit diagram for a preferred embodiment of the present invention.

A preferred embodiment shown in FIG. 7 addresses this problem with the addition of diode connected transistor Q2. When transistor Q2 conducts, the open loop gain is reduced. Also the addition of transistor Q2 moves the pole due to Ccb (collector-base capacitance) far out in frequency since it is now in parallel with $1/gm_{Q2}$ (one divided by the transconductance of transistor Q2—a small resistance), which reduces phase shift. Therefore stability is much easier to obtain under overdrive conditions. If transistor Q3 is made significantly larger than transistor Q2, the overdrive current can remain large and exceeds that in FIG. 4 by approximately the emitter area ratio of transistors Q3 to Q2. The output voltages and output voltage swing are the same as that of the circuit of FIG. 6.

Figure 8:
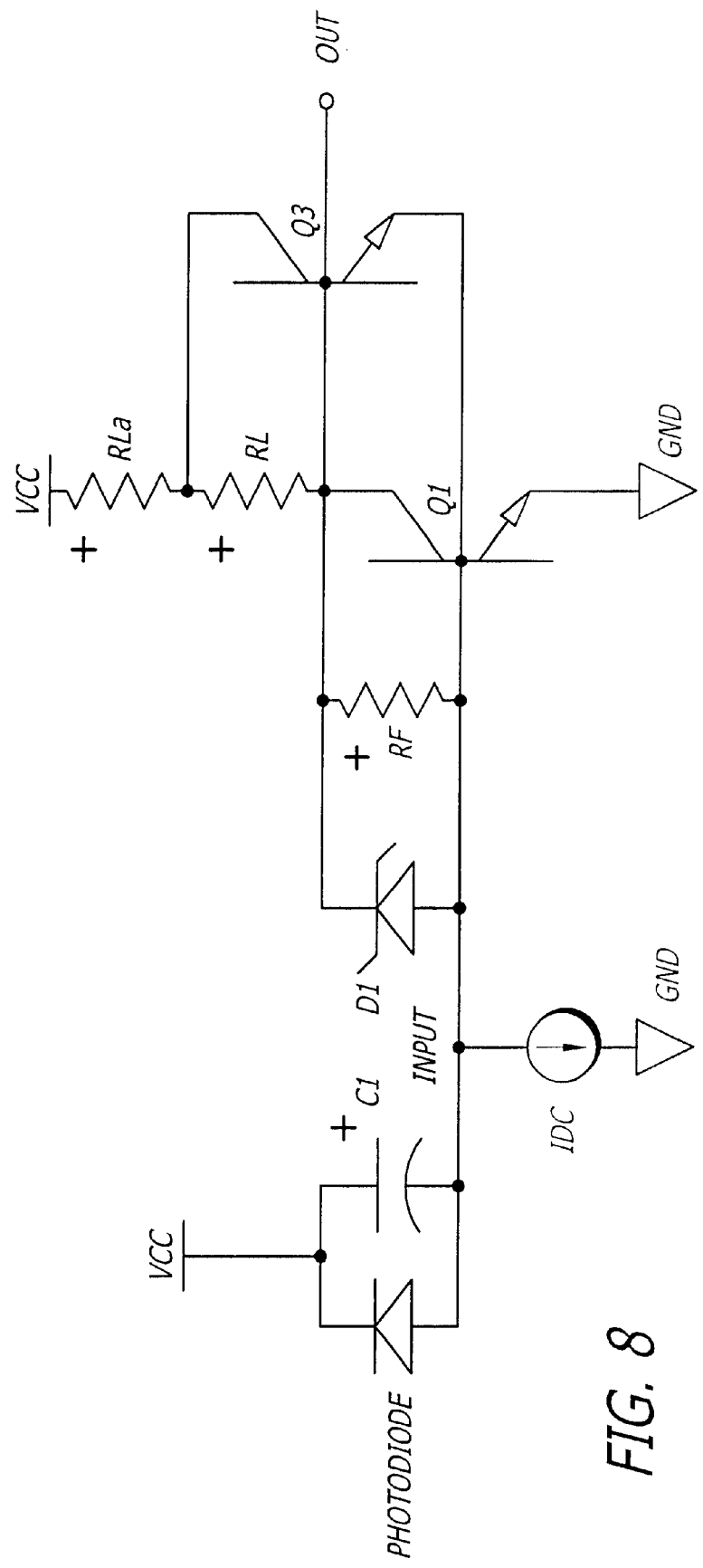
FIG. 8 is a circuit diagram for am embodiment employing an alternate method of improving the feedback stability of FIG. 6 under overdrive conditions.

FIG. 8 shows a circuit employing an alternate method of improving the feedback stability of FIG. 4 under overdrive conditions. This circuit is similar to that of FIG. 6, though in FIG. 8, the load resistor RL is split into two segments and the collector of transistor Q3 is connected to the intermediate point. The current through transistor Q3 reduces the voltage across the resistor RL, effectively reducing its impedance. However the negative input current handling capability is still limited by the resistor RLa (with large negative input currents, the voltage at the collector of transistor Q3 will fall and eventually saturate the amplifier). The output voltages and output voltage swing for this circuit are also the same as that of the circuit of FIG. 6 (assuming the negative input currents are not large enough to cause the collector voltage of transistor Q3 to fall more than the Schottky voltage drop below its bass voltage).

Figure 9:
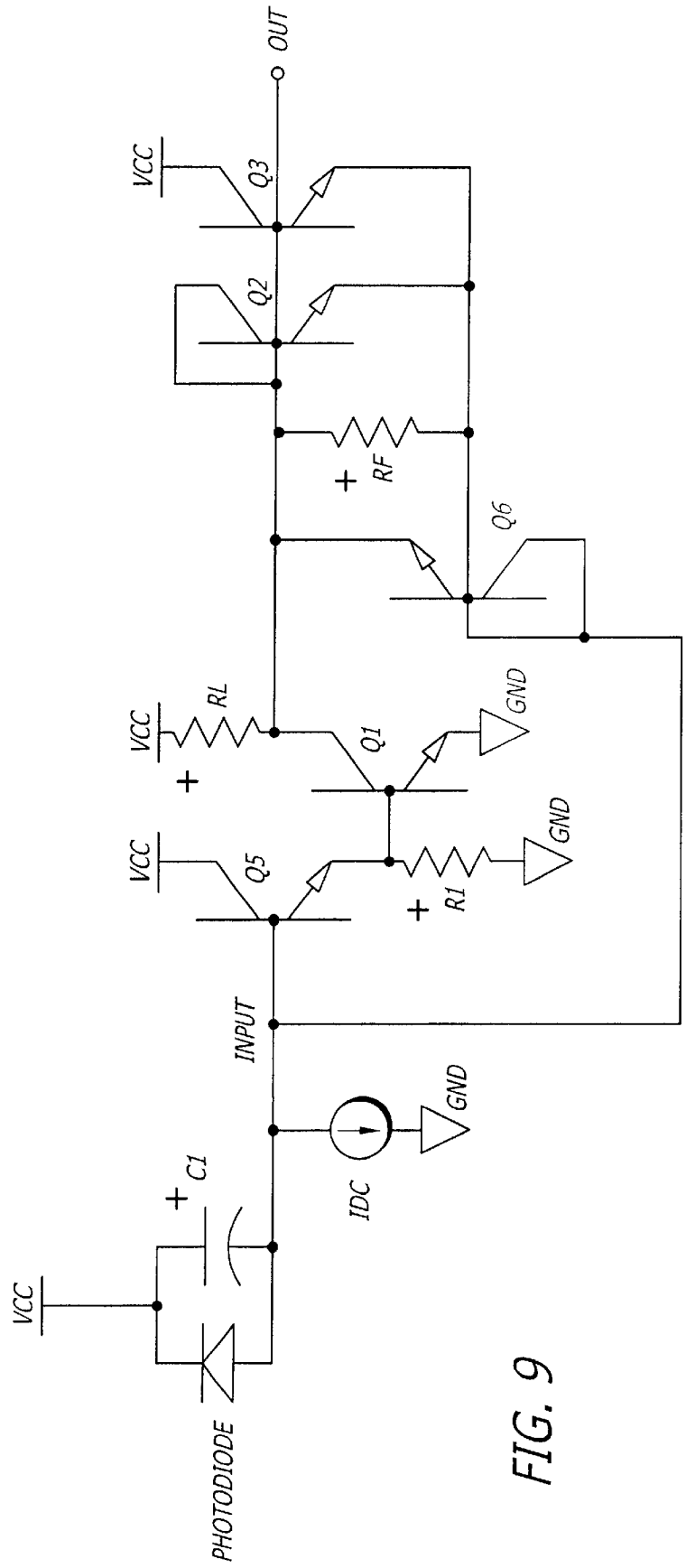
FIG. 9 is a circuit diagram illustrating a modification of the circuit of FIG. 7 to provide symmetrical clamping.

FIG. 9 shows a modification of the circuit of FIG. 7 to provide symmetrical clamping, with the addition of an input emitter follower transistor Q5 and using a diode connected transistor Q6 instead of Schottky diode D1 for positive input overdrive clamping. With the photodiode illuminated to conduct more current than the current source IDC, transistors Q5 and Q1 will tend to turn on to pull the output down until the output is clamped at one Vbe (the Vbe of transistor Q6) below the input voltage of 2 Vbe (the Vbe of transistor Q5 plus the Vbe of transistor Q1), after which the excess input current from the diode is coupled to ground through transistor Q6 and Q1. With the photodiode not illuminated, the current source IDC will tend to turn off transistors Q5 and Q1, allowing the load resistor RL to pull the output up until diode connected transistor Q2 conducts to supply additional base current to transistor Q5 to maintain the input at 2 Vbe (again the Vbe of transistor Q5 plus the Vbe of transistor Q1). Thus the output now will be clamped at 3 Vbe (the Vbe of transistor Q5 plus the Vbe of transistor Q1 plus the Vbe of transistor Q2). Because the input is 2 Vbe instead of Vbe as for the other embodiments, the reverse bias voltage across the photodiode is reduced from vcc–Vbe to vcc–2Vbe. This increases the value of the photodiode capacitance C1, which results in lower bandwidth and an increase in noise.

A major advantage of this new transimpedance amplifier topology is the providing of very large input overdrive current capability without increasing power supply current consumption. Power supply dissipation can be reduced while providing larger input overdrive current specifications when compared to prior art transimpedance amplifiers.

Other additions and improvements are possible by combining the concepts presented herein and/or combining these concepts with other transimpedance amplifier topologies. Thus while certain preferred embodiments of the present invention have been disclosed herein, such disclosure is only for purposes of understanding exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A transimpedance amplifier comprising:

first and second bipolar transistors, each having an emitter, a base and a collector;

a Schottky diode having an anode and a cathode;

a load resistance and a feedback resistance;

the collector of the second transistor being coupled to a first power supply terminal;

the load resistance being coupled between the first transistor;

the first transistor having its collector coupled to the base of the second transistor and to a transimpedance, amplifier output, its base coupled to the emitter of the second transistor and to a transimpedance amplifier input, and its emitter coupled to a second power supply terminal;

the feedback resistance being coupled between the collector and the base of the first transistor; and, the Schottky diode having its cathode coupled to the collector of the first transistor and its anode coupled to the base of the first transistor to provide a lower limit on the magnitude of the collector-emitter voltage of the first transistor when turned on.

2. The transimpedance amplifier of claim 1 further comprised of a third transistor having an emitter, a base and a collector, the collector and base of the third transistor being coupled to the base of the second transistor, the emitter of the third transistor being coupled to the emitter of the second transistor.

3. The transimpedance amplifier of claim 2 wherein the second transistor is larger than the third transistor.

4. The transimpedance amplifier of claim 1 further comprised of a third resistance, the collector of the second transistor and the load resistance being coupled to the first power supply terminal through the third resistance.

5. The transimpedance amplifier of claim 1 wherein the bipolar transistors are npn bipolar transistors.

* * * * *